(12) United States Patent
Lee et al.

(10) Patent No.: US 8,829,487 B2
(45) Date of Patent: Sep. 9, 2014

(54) LIGHT EMITTING DIODE AND METHOD FOR MANUFACTURING THE SAME

(75) Inventors: Wei-Chi Lee, Taoyuan (TW);
Shiue-Lung Chen, Taoyuan (TW);
Jang-Ho Chen, Taoyuan (TW)

(73) Assignee: Walsin Lihwa Corporation, Taoyuan (TW)

( * ) Notice: Subject to any disclaimer, the term of this patent is extended or adjusted under 35 U.S.C. 154(b) by 79 days.

(21) Appl. No.: 13/424,627

(22) Filed: Mar. 20, 2012

(65) Prior Publication Data
US 2012/0241719 A1   Sep. 27, 2012

Related U.S. Application Data

(60) Provisional application No. 61/455,000, filed on Mar. 21, 2011.

(30) Foreign Application Priority Data

Feb. 20, 2012   (TW) .............................. 101105457 A

(51) Int. Cl.
| | |
|---|---|
| H01L 33/46 | (2010.01) |
| H01L 33/38 | (2010.01) |
| H01L 33/00 | (2010.01) |
| H01L 33/20 | (2010.01) |
| H01L 33/22 | (2010.01) |
| H01L 33/40 | (2010.01) |

(52) U.S. Cl.
CPC .......... *H01L 33/382* (2013.01); *H01L 33/0079* (2013.01); *H01L 33/22* (2013.01); *H01L 33/405* (2013.01); *H01L 2933/0016* (2013.01); *H01L 33/20* (2013.01)
USPC .......................................................... 257/13

(58) Field of Classification Search
USPC .......................................................... 257/13
See application file for complete search history.

(56) References Cited

U.S. PATENT DOCUMENTS

| 6,773,943 | B2 * | 8/2004 | Oohata et al. .................. 438/30 |
| 2003/0157741 | A1 * | 8/2003 | Oohata et al. .................. 438/34 |
| 2004/0263285 | A1 * | 12/2004 | Suzuki et al. .................. 333/181 |
| 2006/0097278 | A1 * | 5/2006 | Goto et al. .................... 257/103 |
| 2007/0096119 | A1 * | 5/2007 | Sato ............................... 257/81 |

* cited by examiner

*Primary Examiner* — Thao P Le
(74) *Attorney, Agent, or Firm* — McClure, Qualey & Rodack, LLP

(57) ABSTRACT

A light emitting diode (LED) is provided. The LED includes a carrying substrate, a semiconductor composite layer and an electrode. The semiconductor composite layer is disposed on the carrying substrate, and an upper surface of the semiconductor composite layer includes a patterned surface and a flat surface. The electrode is disposed on the flat surface. A method for manufacturing the light emitting diode is provided as well.

15 Claims, 12 Drawing Sheets

US 8,829,487 B2

LIGHT EMITTING DIODE AND METHOD FOR MANUFACTURING THE SAME

RELATED APPLICATIONS

This application claims priority to U.S. Provisional Application Ser. No. 61/455,000 filed Mar. 21, 2011, and Taiwan Application Serial Number 101105457, filed Feb. 20, 2012, the disclosures of which are incorporated herein by reference in their entireties.

BACKGROUND

1. Technical Field

The present invention generally relates to a light emitting diode and a method for manufacturing the same.

2. Description of Related Art

Along with the progress of the techniques, light emitting diodes (LEDs) have gained much attention since lighting devices are required of not only high lighting efficiency but also low power consumption. LEDs are advantageous in high lighting efficiency, short response time, long lifetime and mercury free. Furthermore, LEDs also have advantages of a small volume, wide color space as well as high impact resistance. Accordingly, conventional lighting devices are gradually replaced by LEDs. In recent years, with fast developments of the LED techniques, the application of the LEDs has rapidly increased. LEDs seem to become a major light source in $21^{st}$ century.

SUMMARY

An object of the present invention is to provide a light emitting diode. The light emitting diode is characterized in that an electrode forms an excellent ohmic contact with a semiconductor layer, thus reducing the operation voltage of the light emitting diode. Optionally, the light emitting diode has a roughness surface that is capable of increasing the light extraction efficiency of the light emitting diode.

The light emitting diode includes a carrying substrate, a semiconductor composite layer and an electrode. The semiconductor composite layer is disposed on the carrying substrate, in which an upper surface of the semiconductor composite layer comprises a patterned surface and a flat surface. The electrode is disposed on the flat surface.

Another object of the present invention is to provide a method for manufacturing a light emitting diode. In one embodiment, the method comprises the steps of: (a) forming a buffer layer on a surface of a substrate, wherein the surface comprises a patterned region and a flat region; (b) forming a semiconductor composite layer on the buffer layer; (c) forming a carrying substrate on the semiconductor composite layer; (d) separating the substrate from the buffer layer to form a patterned surface and a first flat surface on the buffer layer, wherein the patterned surface and the first flat surface are respectively complementary to the patterned region and the flat region of the surface of the substrate; (e) etching the first flat surface to form an opening penetrating through the buffer layer and thereby forming a second flat surface on the semiconductor composite layer within the opening; and (f) forming an electrode on the second flat surface.

In another embodiment, the method comprises the steps of: (a) forming a buffer layer on an upper surface of a substrate, wherein the upper surface comprises a patterned region and a flat region; (b) forming a semiconductor composite layer on the buffer layer; (c) forming a carrying substrate on the semiconductor composite layer; (d) separating the substrate from the buffer layer to form a first patterned surface and a first flat surface on the buffer layer, wherein the first patterned surface and the first flat surface are respectively complementary to the patterned region and the flat region of the upper surface; (e) removing the buffer layer and a portion of the semiconductor composite layer to form a second patterned surface and a second flat surface on the semiconductor composite layer, wherein the second patterned surface and the second flat surface are respectively corresponded to the first patterned surface and the first flat surface; and (f) forming an electrode on the second flat surface.

A further object of the present invention is to provide a substrate for manufacturing a light emitting diode. The substrate has a surface with both a patterned region and a flat region.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
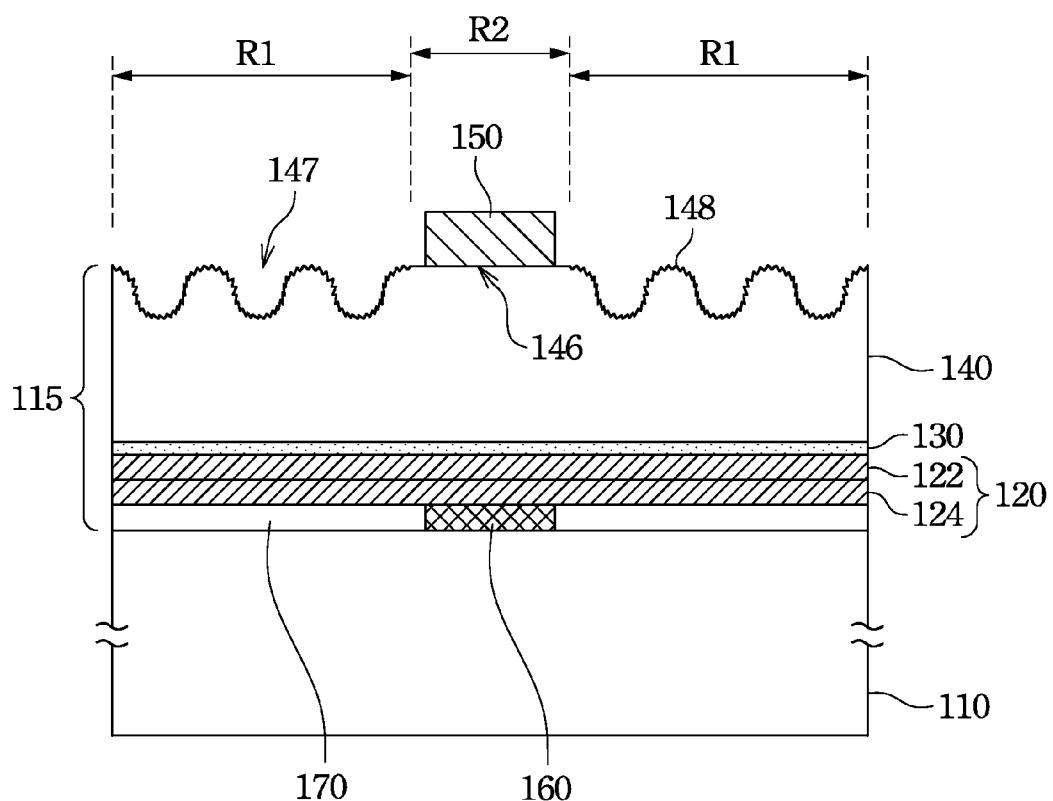
FIG. 1 is a cross-sectional view schematically illustrating a light emitting diode according to one embodiment of the present invention.

Reference will now be made in detail to the present embodiments of the invention, examples of which are illustrated with the accompanying drawings. Wherever possible, the same reference numbers are used in the drawings and the description to refer to the same or like parts.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

FIG. 1 is a cross-sectional view schematically illustrating a light emitting diode 100 according to one embodiment of the present invention. The light emitting diode 100 includes a carrying substrate 110, a semiconductor composite layer 115 and an electrode 150.

The carrying substrate 110 is configured to support the structure of the light emitting diode thereon. The carrying substrate 110 may be made of a conductive material, an insulating material or a composite material. For examples, the conductive material may be gold, copper, nickel, cobalt, tin, aluminum, silver, indium, iron, palladium, platinum, molybdenum, tungsten, chromium, lead, stibium, titanium, tantalum, rhodium, zinc, zirconium, silicon, germanium alloy or a combination thereof. The insulating material may be a ceramic material such as aluminum oxide ($Al_2O_3$), aluminum nitride (AlN) or beryllium oxide (BeO). The composite material may be a combination of the insulating material and the conductive material mentioned above. The thickness of the carrying substrate 110 may be about 10 μm to 300 μm.

In one embodiment of the present invention described hereinafter, the carrying substrate 110 is made of a conductive material, and the carrying substrate 110 may serve as a positive electrode of the light emitting diode 100. The semiconductor composite layer 115 is disposed on the carrying substrate 110. An upper surface of the semiconductor composite layer 115 includes a patterned surface 147 and a flat surface 146. As shown in FIG. 1, the patterned surface 147 is formed in a region R1, whereas the flat surface 146 is formed in a region R2. The patterned surface 147 is a textured structure that provides a height fluctuation of the surface, whereas the flat surface 146 does not include any textured structure. In one example, the textured structure of the patterned surface 147 has a regular profile. In another example, the patterned surface 147 of the semiconductor composite layer 115 may further include a roughness surface 148 that is used to destroy the total reflection occurring in the light emitting device, such that the light extraction efficiency may be increased. The term "light extraction efficiency" refers to the proportion of light that can be extracted to the outside of the light emitting diode amongst the light generated in the light emitting diode.

The electrode 150 is disposed on the flat surface 146 of the semiconductor composite layer 115, and therefore the electrode 150 may form an excellent ohmic contact with the semiconductor composite layer 115, thus reducing the required operation voltage of the light emitting diode. The electrode 150 may be made of a conductive material such as silver, gold, chromium, titanium, nickel or a combination thereof. In one example, the thickness of the electrode 150 is about 1 nm to about 20 μm, and is preferably about 0.5 μm to about 5 μm.

In one embodiment, the semiconductor composite layer 115 includes a first semiconductor layer 120, an active layer 130, a second semiconductor layer 140, a current barrier 160 and a reflecting layer 170, as shown in FIG. 1.

The current barrier 160 is disposed on the carrying substrate 110. The current barrier 160 is configured to uniformly distribute the current in the light emitting diode 100, thus reducing the current crowding effect. In one example, the vertical projection of the current barrier 160 and the vertical projection of the electrode 150 on the carrying substrate 110 are totally or partially overlapped. In other words, the current barrier 160 is substantially aligned with the electrode 150. In another example, the area of the current barrier 160 is equal to or greater than the area of the electrode 150. The thickness of the current barrier 160 may be about 1 nm to about 5 μm, for example. The current barrier 160 may comprise an insulating material such as silicon nitride or silicon oxide. Alternatively, the current barrier 160 may include a conductive material.

The reflecting layer 170 is disposed on the carrying substrate 110 and surrounds the current barrier 160. Specifically, the reflecting layer 170 is arranged at a periphery of the current barrier 160 and adjacent to the current barrier 160.

The reflecting layer 170 is capable of reflecting the light emitted from the active layer 130, and changing the light transmission direction to increase the light extraction efficiency. The reflecting layer 170 may be made of a metal material such as aluminum, nickel, platinum, gold, silver or a combination thereof. Alternatively, the reflecting layer 170 may be made of a Bragg reflector composed of the metal material mentioned above and insulating materials such as silicon dioxide and titanium dioxide with varying refractive index. In one example, the thickness of the reflecting layer 170 is substantially equal to that of the current barrier 160. In the example that the current barrier 160 includes conductive material, the conductivity of the material of the current barrier 160 is smaller than that of the reflecting layer 170.

The first semiconductor layer 120 is disposed on the current barrier 160 and the reflecting layer 170. In one example, the first semiconductor layer 120 includes a p-type cladding layer 122 and a p-type semiconductor layer 124. The p-type cladding layer 122 is adjacent to the active layer 130 while the p-type semiconductor layer 124 is adjacent to both the current barrier 160 and the reflecting layer 170. For example, the p-type cladding layer 122 may be a layer of p-AlGaN, and the p-type semiconductor layer 124 may be a layer of p-GaN.

The active layer 130 is disposed on the first semiconductor layer 120. The active layer 130 may be a multiple-layered structure such as a multiple quantum-wells structure. In one example, the area of the electrode 150 is less than 30% of the area of the active layer 130. For example, the area of the electrode 150 may be 2% to 15% of the area of the active layer 130.

The second semiconductor layer 140 is disposed on the active layer 130. The patterned surface 147 and the flat surface 146 of the semiconductor composite layer 115 described before are formed on an upper surface of the second semiconductor layer 140, as shown in FIG. 1. In one example, the second semiconductor layer 140 may be a layer of n-GaN.

Figure 2:
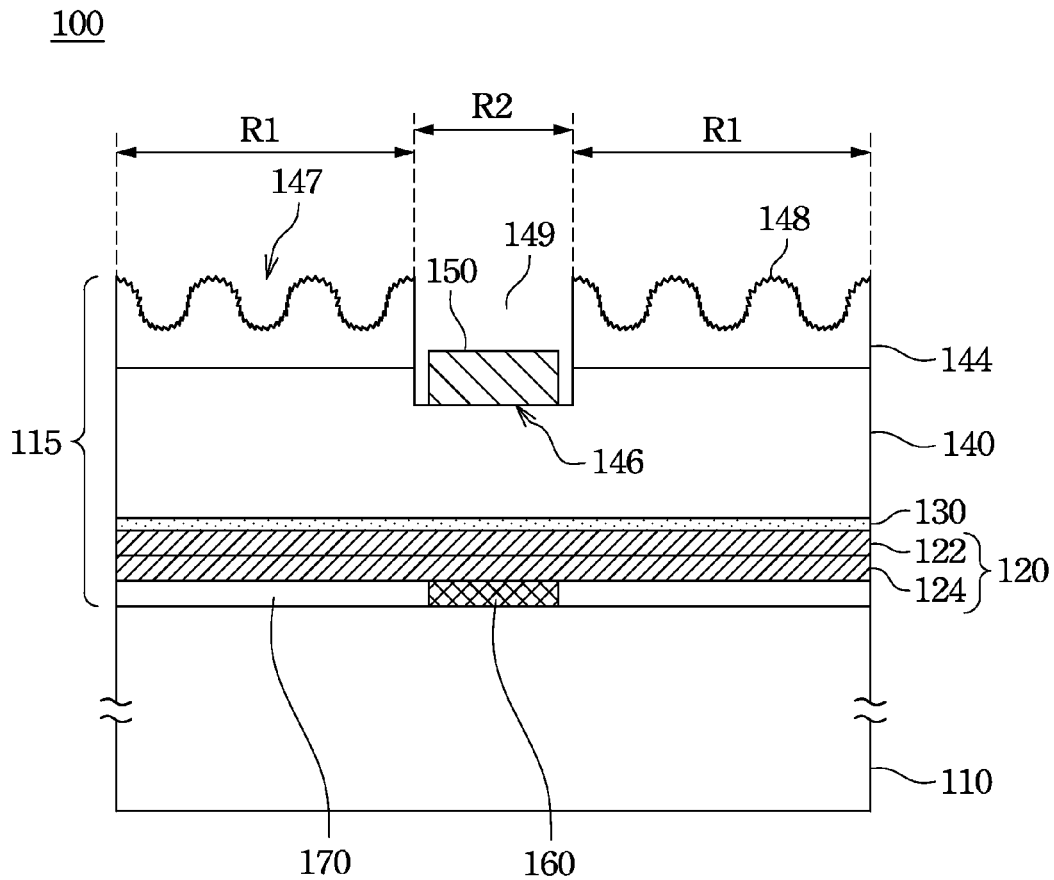
FIG. 2 is a cross-sectional view schematically illustrating a light emitting diode according to another embodiment of the present invention.

FIG. 2 is a cross-sectional view schematically illustrating a light emitting diode 100 according to another embodiment of the present invention. The light emitting diode 100 includes a carrying substrate 110, a semiconductor composite layer 115 and an electrode 150. The examples and features of the carrying substrate 110 may be the same as those described before in FIG. 1.

In this embodiment, the semiconductor composite layer 115 includes a current barrier 160, a reflecting layer 170, a first semiconductor layer 120, an active layer 130, a second semiconductor layer 140 and an opening 149. The features and embodiments of current barrier 160, the reflecting layer 170, the first semiconductor layer 120 and the active layer 130 may be the same as those described before.

In this embodiment, the second semiconductor layer 140 is disposed on the active layer 130. It is noted that the second semiconductor layer 140 has a buffer layer 144 positioned on the surface of the second semiconductor layer 140. The patterned surface 147 of the semiconductor composite layer 115 described before is formed on the buffer layer 144, as shown in FIG. 2. The patterned surface 147 of the buffer layer 144 is formed in the region R1 of the second semiconductor layer 140, whereas the flat surface 146 is formed in the region R2 of the second semiconductor layer 140. The patterned surface 147 is a textured structure that provides a height fluctuation of the surface, whereas the flat surface 146 does not includes any textured structure. In one example, the textured structure of the patterned surface 147 has a regular profile. In another example, the patterned surface 147 of the buffer layer 144 may further include a roughness surface 148 that is used to destroy the total reflection occurring in the light emitting device, such that the light extraction efficiency may be increased.

The opening 149 penetrates through the buffer layer 144 to expose the flat surface 146 of the second semiconductor layer 140. In other words, the depth of the opening 149 is greater than the thickness of the buffer layer 144, and the flat surface 146 is formed at the bottom of the opening 149.

The electrode 150 is disposed on the flat surface 146 within the opening 149, and therefore the electrode 150 may form an excellent ohmic contact with the second semiconductor layer 140, thus reducing the required operation voltage of the light emitting diode. The vertical projection of the electrode 150 and the vertical projection of the electrode 150 on the carrying substrate 110 are totally or partially overlapped. The features, materials and embodiments of the electrode 150 may be the same as those described before. In one example, the area of the electrode 150 is smaller than or equal to the area of the current barrier 160.

Figure 3:
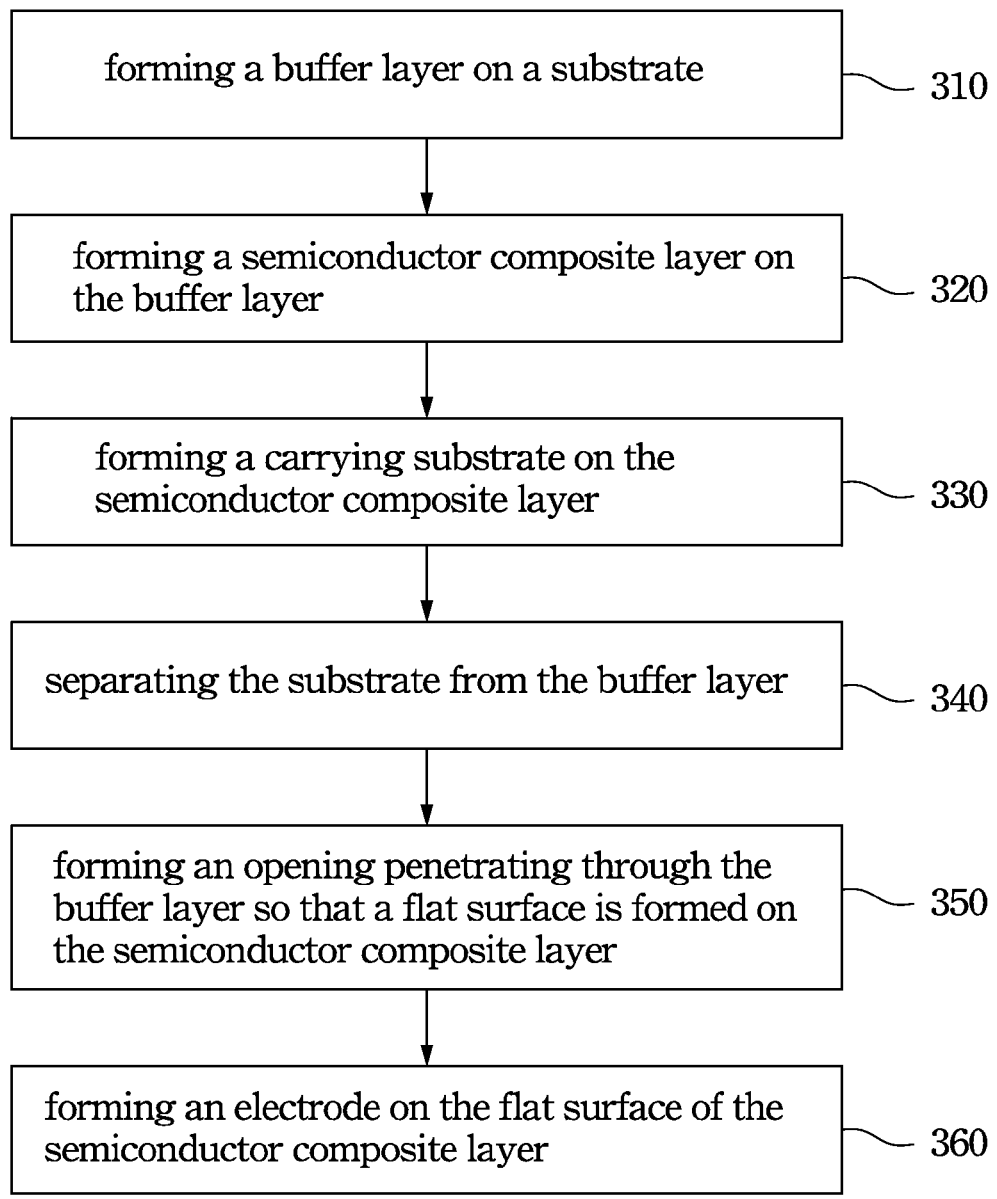
FIG. 3 is a flow chart showing a method for manufacturing a light emitting diode according to one embodiment of the present invention.

According to another embodiment of the present invention, a method for manufacturing a light emitting diode is provided. FIG. 3 is a flow chart showing a method 300 for manufacturing a light emitting diode according to one embodiment of the present invention. FIG. 4A to FIG. 4F are cross-sectional views illustrating the process steps of the method 300 illustrated in FIG. 3.

In step 310, a buffer layer 144 is formed on an upper surface of a substrate 102. The upper surface of the substrate 102 has a surface profile 1021 that includes a patterned region R1 and a flat region R2. The patterned region R1 is a textured structure with a height fluctuation, whereas the flat region R2 does not include any textured structure. Accordingly, the buffer layer 144 formed on the substrate 102 has a flat interface 146a and a patterned interface 147a respectively corresponded to the flat region R2 and the patterned region R1 of the surface profile 1021. In one example, the substrate 102 may be a sapphire substrate, a silicon carbide substrate, a gallium nitride substrate, a zinc oxide substrate or a silicon substrate.

In step 320, a semiconductor composite layer 115 is formed on the buffer layer 144. In one embodiment, the formation of the semiconductor composite layer 115 includes the steps described below. Firstly, a second semiconductor layer 140 is formed on the buffer layer 144. The second semiconductor layer 140 may be an n-type semiconductor layer, for example. Next, an active layer 130 is formed on the second semiconductor layer 140. The active layer 130 may be a multiple-layered structure such as a multiple quantum-wells structure. Subsequently, a first semiconductor layer 120 is formed on the active layer 130. In one example, the first semiconductor layer 120 may include a p-type cladding layer 122 and a p-type semiconductor layer 124, in which the p-type cladding layer 122 is adjacent to the active layer 130. Then, a current barrier 160 is formed on the first semiconductor layer 120. The vertical projection of the current barrier 160 on the substrate 102 and the flat region R2 are overlapped (either completely or partially). In one example, the area of the current barrier 160 is greater than or equal to that of the flat region R2. The current barrier 160 may comprise an insulating material such as silicon nitride or silicon oxide. Alternatively, the current barrier 160 may comprise a conductive material. Subsequently, a reflecting layer 170 is formed on the first semiconductor layer 120. The reflecting layer 170 surrounds the current barrier 160, and is adjacent to the current barrier 160. For example, the reflecting layer 170 may be formed above the patterned region R1. The reflecting layer 170 may be made of a metal material such as aluminum, nickel, platinum, gold, silver or a combination thereof. In some examples, the reflecting layer 170 may be made of a Bragg reflector composed of the metal material mentioned above and insulating materials such as silicon dioxide and titanium dioxide with varying refractive index. The thickness of the reflecting layer 170 is substantially equal to that of the current barrier 160 in one embodiment of the present invention.

Figure 4A:
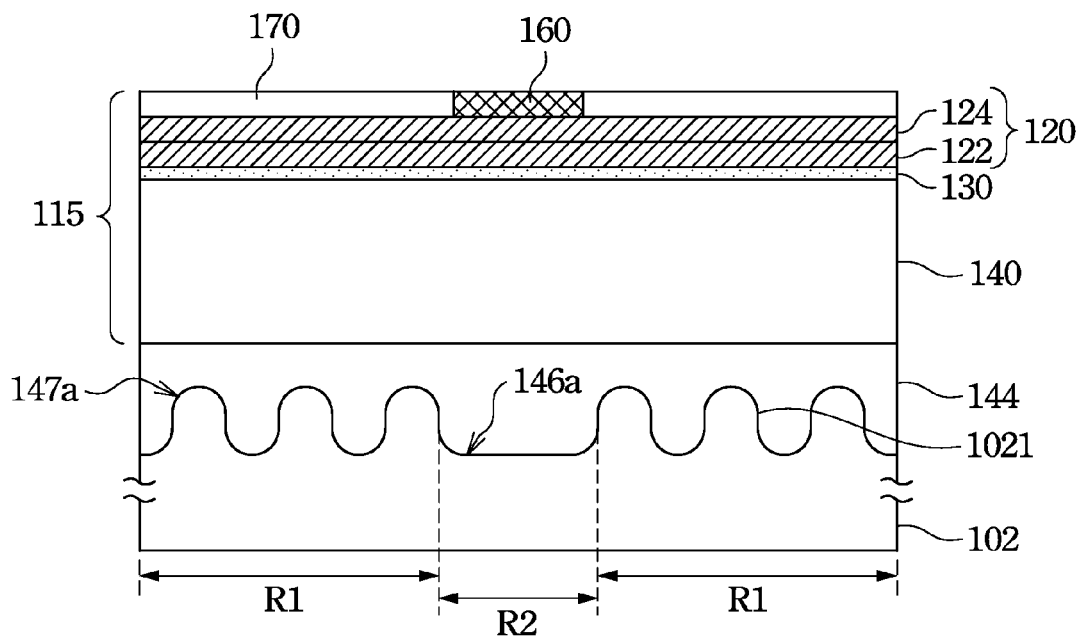
FIG. 4A to FIG. 4F are cross-sectional views illustrating the process steps of the method illustrated in FIG. 3.
Figure 4B:
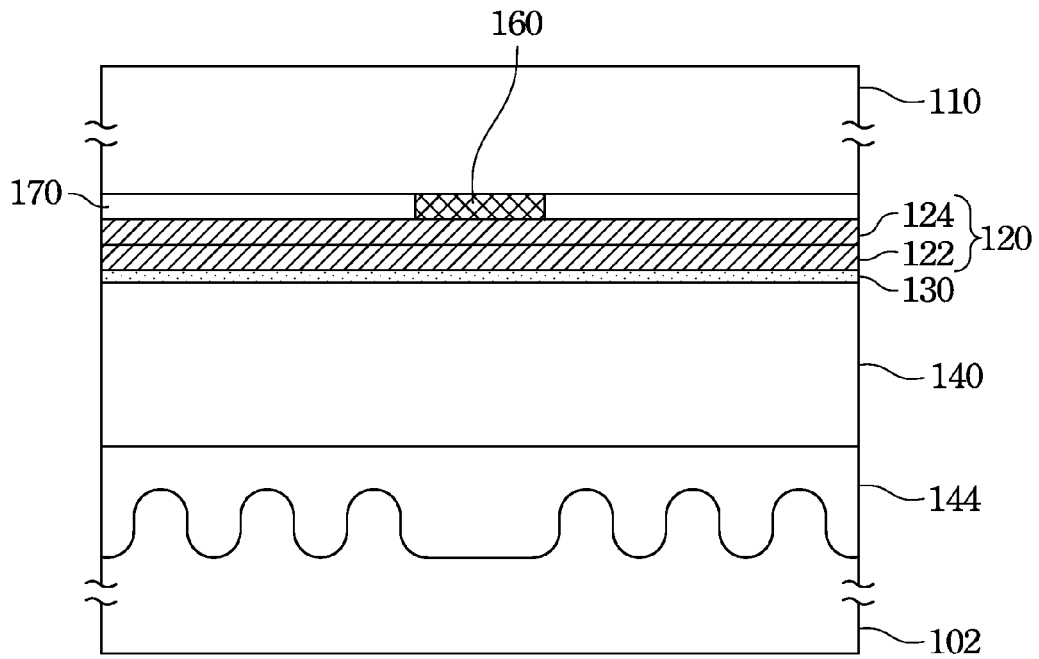

In step 330, a carrying substrate 110 is formed on the semiconductor composite layer 115, as shown in FIG. 4B. The carrying substrate 110 may be formed by an electroplating process, a wafer bonding process or a chemical plating process.

Figure 4C:
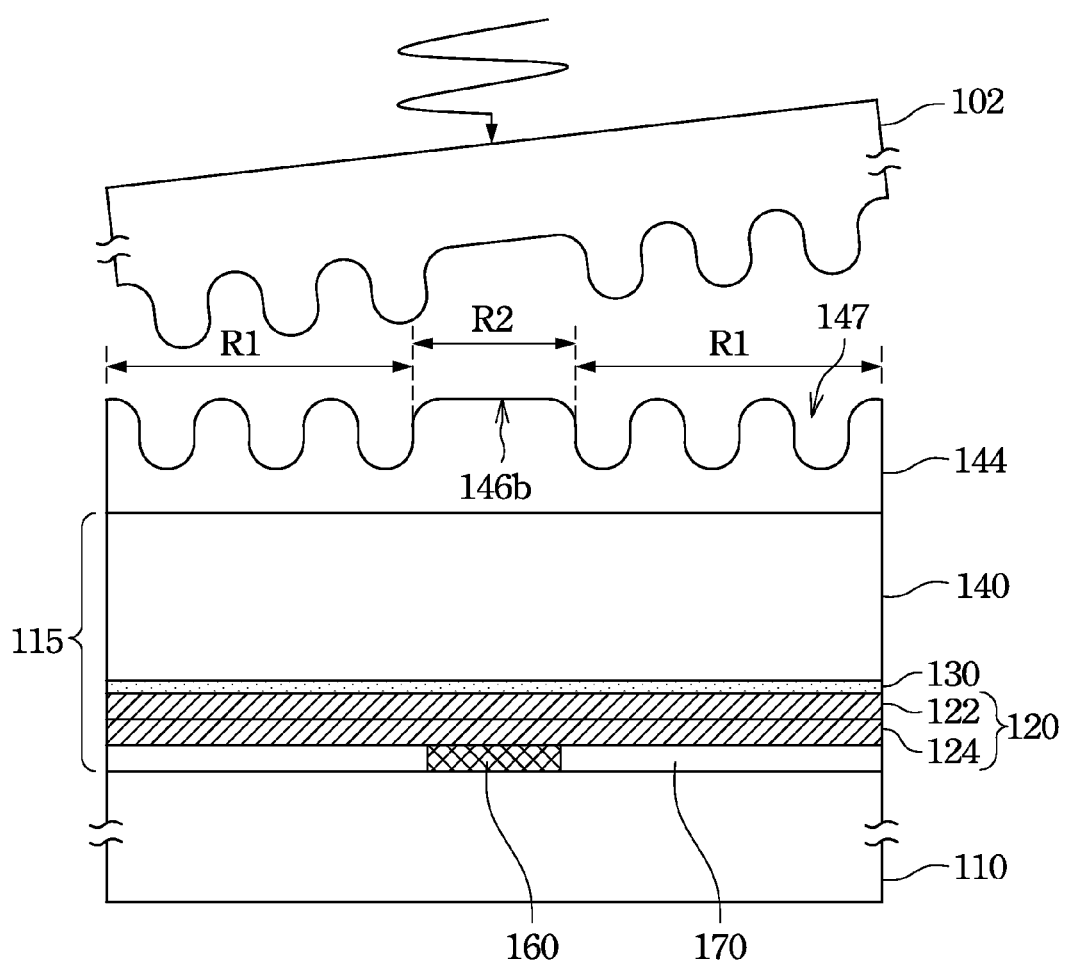

In step 340, as shown in FIG. 4C, the substrate 102 is separated from the buffer layer 144 such that a patterned surface 147 and a first flat surface 146b are form on the buffer layer 144, in which the patterned surface 147 and the first flat surface 146b are respectively complementary to the patterned region R1 and the flat region R2 of the surface of the substrate 102. In one embodiment, either a laser lift-off process using excimer laser or a wet etching process may be employed to separate the substrate 102 from the buffer layer 144. The wavelength of the excimer laser may be about 193 nm to 248 nm.

Figure 4D:
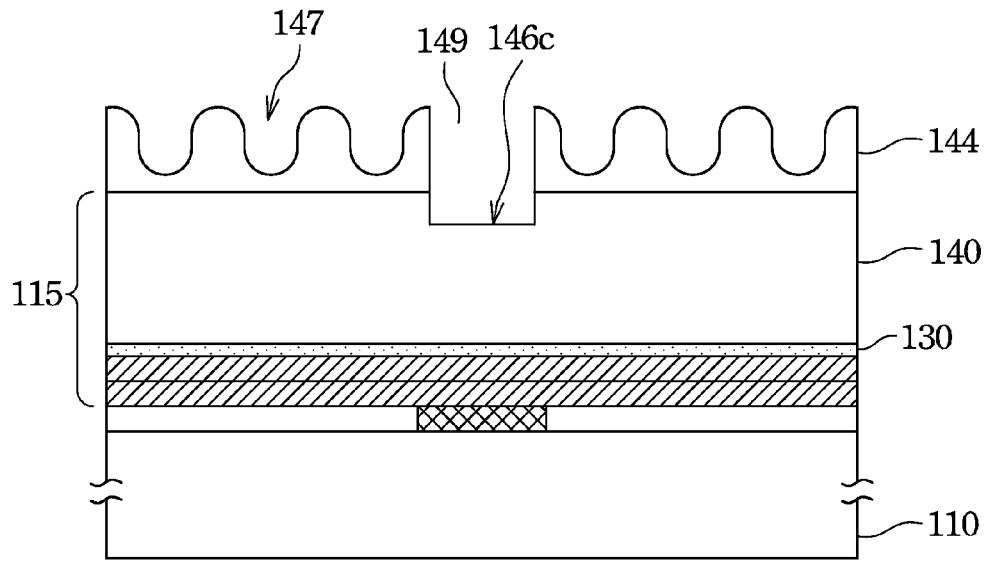

In step 350, the first flat surface 146b of the buffer layer 144 is etched to form an opening 149, as shown in FIG. 4D. An anisotropic etching process or an isotropic etching process using a photoresist or a protective layer as a mask may be utilized to etch the first flat surface 146b of the buffer layer 144. The opening 149 penetrates through the buffer layer 144 such that a second flat surface 146c is formed on the semiconductor composite layer 115 within the opening 149. In one embodiment, a photolithography technique and an anisotropic etching process may be employed to form the opening 149 and the second flat surface 146c. More specifically, an inductive coupling plasma etching technology may be employed to perform the anisotropic etching process. In another embodiment, the opening 149 is at a position corresponded to the current barrier 160. In other words, the opening 149 is located at a position substantially right above the current barrier 160.

Figure 4E:
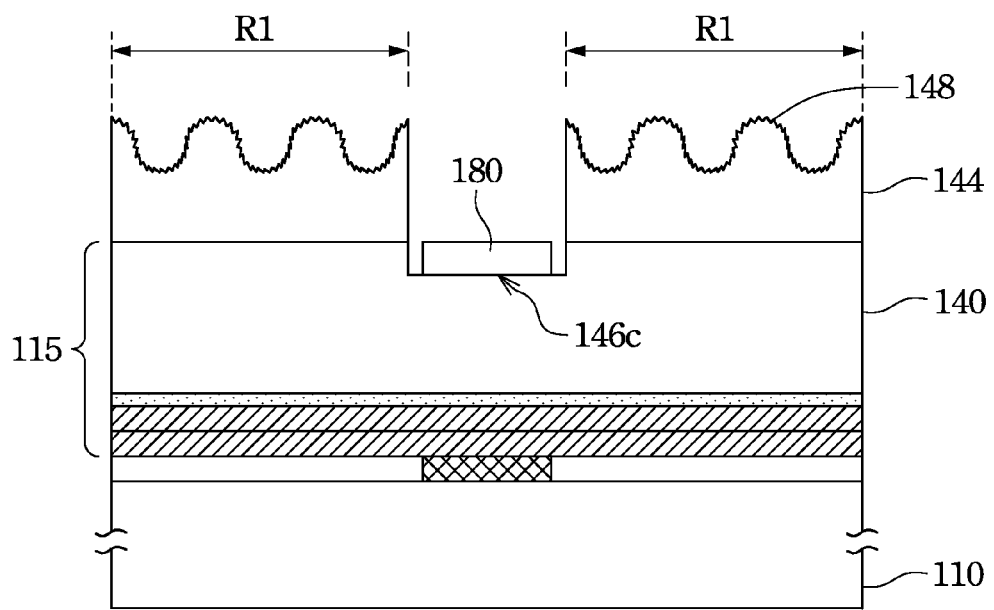

Optionally, after step 350, a roughening step may be performed to form a roughness surface 148 on the patterned surface 147, as shown in FIG. 4E. In one embodiment, the roughening step includes the steps described below. Firstly, a protective layer 180 is formed to cover the second flat surface 146c that is exposed through the opening 149, and then the patterned surface 147 is roughened to form the roughness surface 148 by a roughening process. Subsequently, the protective layer 180 is removed from the second flat surface 146c. The material of the protective layer 180 may be silicon oxide or an organic photoresist material. The roughening process described above may be a wet etching or a dry etching process.

Figure 4F:
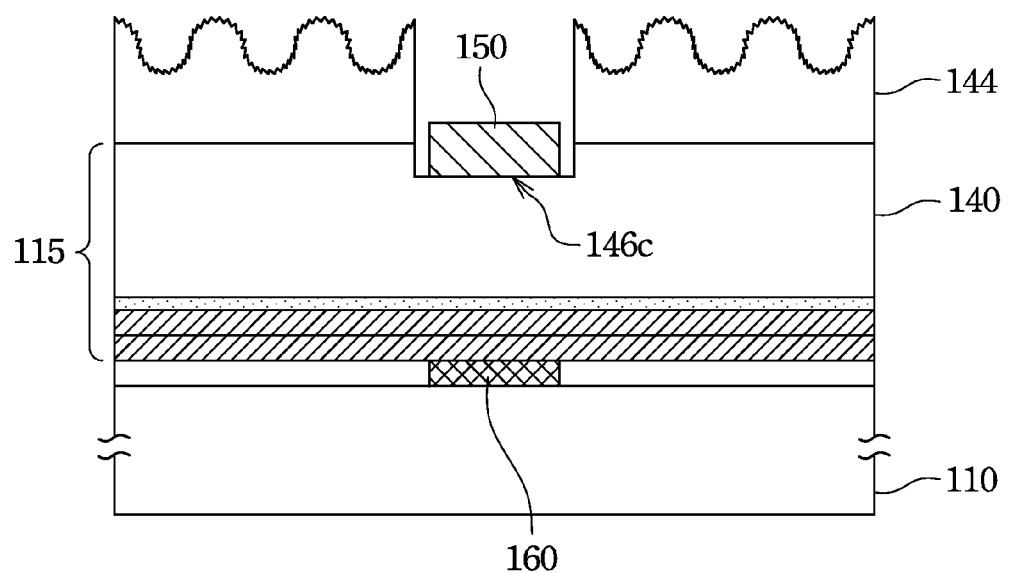

In step 360, an electrode 150 is formed on the second flat surface 146c, as shown in FIG. 4F. The electrode 150 may be formed by a sputtering process, an evaporation process or an electroplating process. In one example, the positions of the electrode 150 and the opening 149 are corresponded to the position of the current barrier 160. In other words, both the electrode 150 and the opening 149 are positioned substantially right above the current barrier 160. In this embodiment, since the electrode 150 is formed on the second flat surface 146c, the electrode 150 may form an excellent ohmic contact with the semiconductor composite layer 115.

Figure 5:
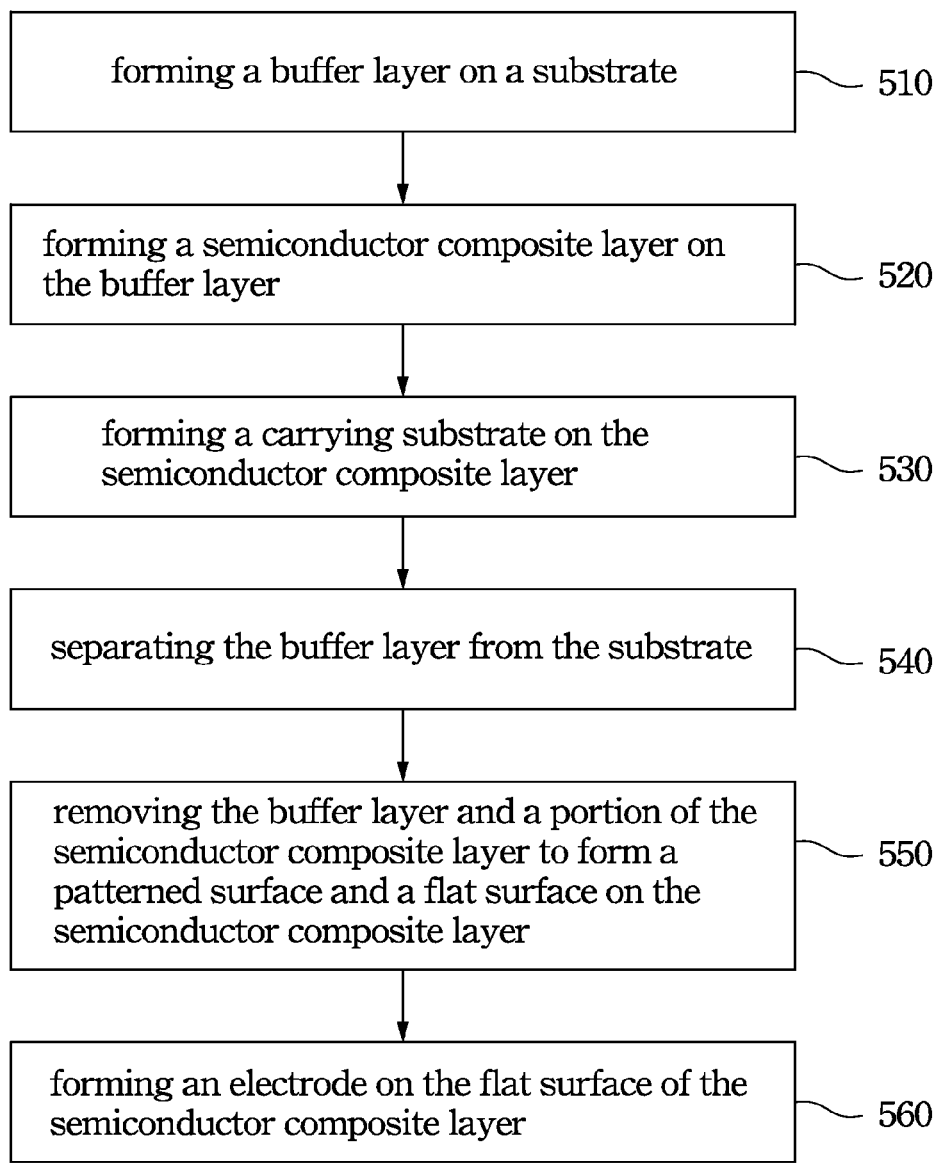
FIG. 5 is a flow chart showing a method for manufacturing a light emitting diode according to another embodiment of the present invention.

FIG. 5 is a flow chart showing a method 500 for manufacturing a light emitting diode according to another embodiment of the present invention. In this embodiment, the details of step 510, step 520 and step 530 may be the same as those described in step 310, step 320 and step 330, respectively. FIG. 6A to FIG. 6D are cross-sectional views illustrating the process steps of the method 500 after step 540.

Figure 6A:
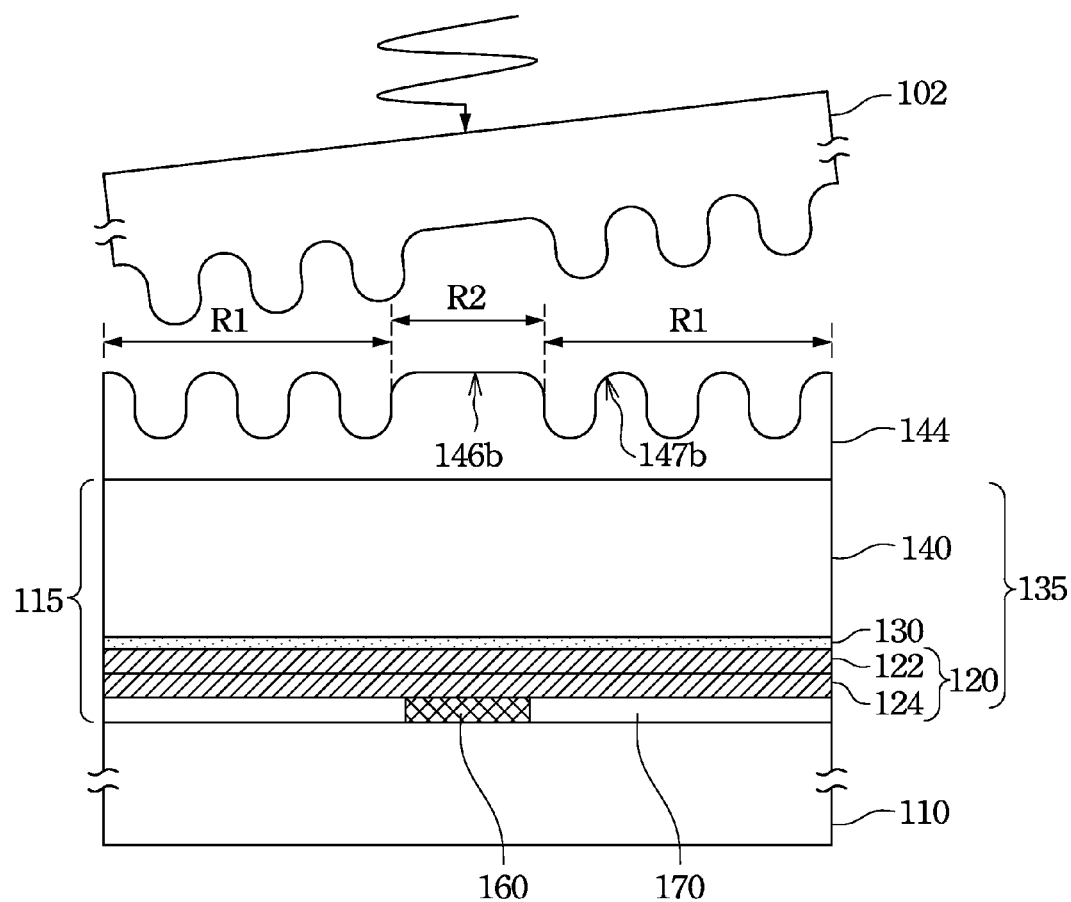
FIG. 6A to FIG. 6D are cross-sectional views illustrating the process steps of the method illustrated in FIG. 5.

In step 540, as shown in FIG. 6A, the substrate 102 is separated from the buffer layer 144 such that a first patterned surface 147b and a first flat surface 146b are form on the buffer layer 144, in which the first patterned surface 147b and the first flat surface 146b are respectively complementary to the patterned region R1 and the flat region R2 of the surface of the substrate 102. The method of separating the substrate 102 from the buffer layer 144 may be the same as those described in step 340.

Figure 6B:
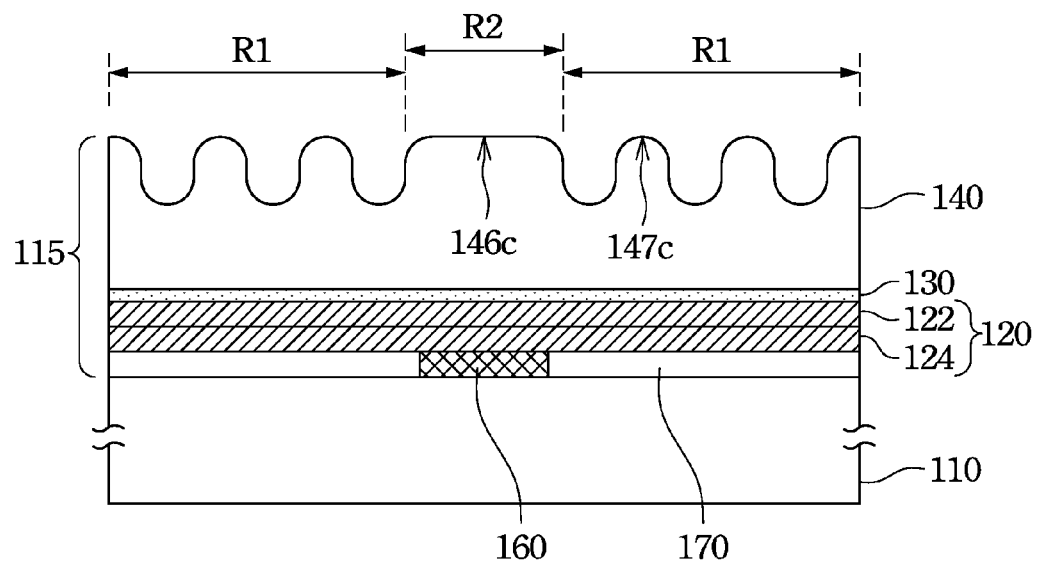

In step 550, the buffer layer 144 and a portion of the semiconductor composite layer 115 are removed to form a second patterned surface 147c and a second flat surface 146c on the semiconductor composite layer 115, in which the second patterned surface 147c and the second flat surface 146c are respectively corresponded to the first patterned surface 147b and the first flat surface 146b, as shown in FIG. 6B. An anisotropy etching process may be utilized to remove the buffer layer 144 and the portion of the semiconductor composite layer 115. In particular, since the buffer layer 144 has different thicknesses, the portion under the recesses of the buffer layer 144 would be completely etched earlier than other portions of the buffer layer 144 during the etching process, thus exposing the semiconductor composite layer 115 thereunder. Accordingly, the portion of the semiconductor composite layer 115 beneath the recesses of the buffer layer 144 is etched first, and thus the etching depth thereof is greater than that of other portions. In contrast, the bulge of the buffer layer 144 has a larger thickness such that it takes more time to be completely etched. Therefore, the portion of the semiconductor composite layer 115 beneath the bulge of the buffer layer 144 would be etched later, and thus the etching depth thereof is smaller than that of other portions. Accordingly, in step 550, the second patterned surface 147c and the second flat surface 146c are formed on the semiconductor composite layer 115 in a way that the profiles of the second patterned surface 147c and the second flat surface 146c are respectively corresponded to the first patterned surface 147b and the first flat surface 146b. That is, the surface profile of the buffer layer 144 is transferred to the semiconductor composite layer 115.

Figure 6C:
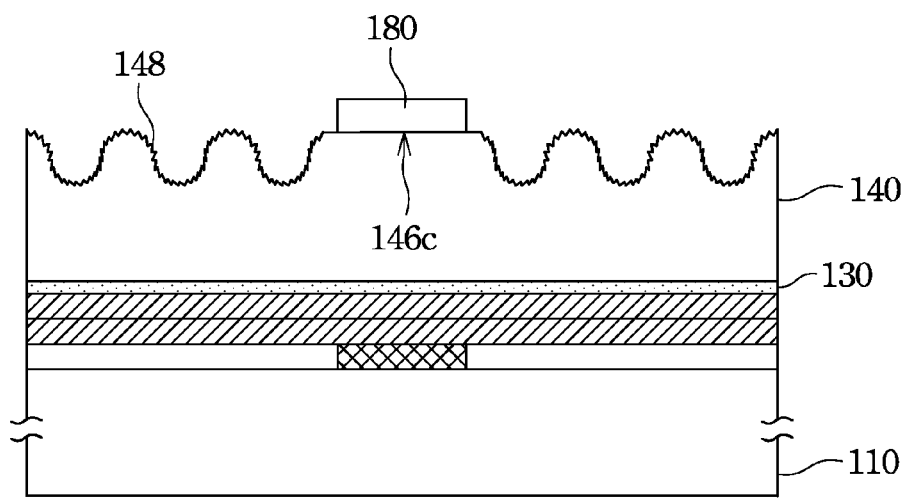

Optionally, after step 550, a roughening step may be performed to form a roughness surface 148 on the second patterned surface 147c, as shown in FIG. 6C. In one embodiment, the roughening step includes the steps described below. First, a protective layer 180 is formed to cover the second flat surface 146c of the semiconductor composite layer 115, and then the second patterned surface 147c is roughened to form the roughness surface 148. After the roughness surface 148 is formed, the protective layer 180 is removed. The details of the roughening step may be the same as those described before.

Figure 6D:
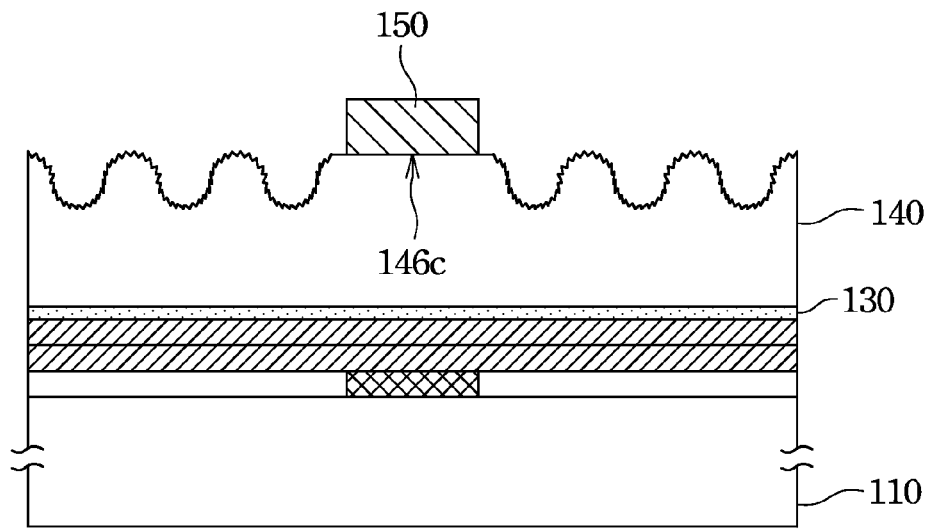

In step 560, an electrode 150 is formed on the second flat surface 146c, as shown in FIG. 6D. The methods of forming the electrode 150 may be the same as these described hereinbefore.

Figure 7:
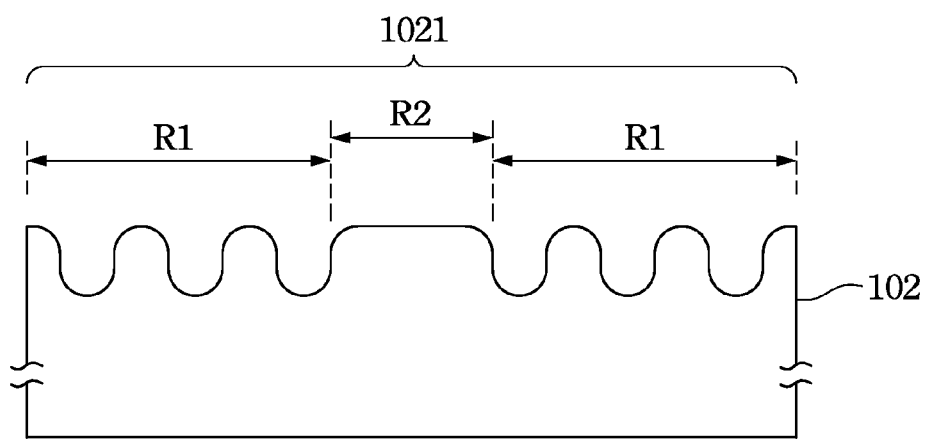
FIG. 7 is a cross-sectional view schematically illustrating a substrate for manufacturing a light emitting diode according to one embodiment of the present invention.

According to still another embodiment of the present invention, a substrate 102 for manufacturing a light emitting diode is provided, as shown in FIG. 7. The surface profile of the substrate 102 has a patterned region R1 and a flat region R2. The substrate 102 may be a sapphire substrate, a silicon carbide substrate or an aluminum nitride substrate. The flat region R2 of the substrate 102 is configured to be the flat surface for forming the light emitting diode.

Figure 8:
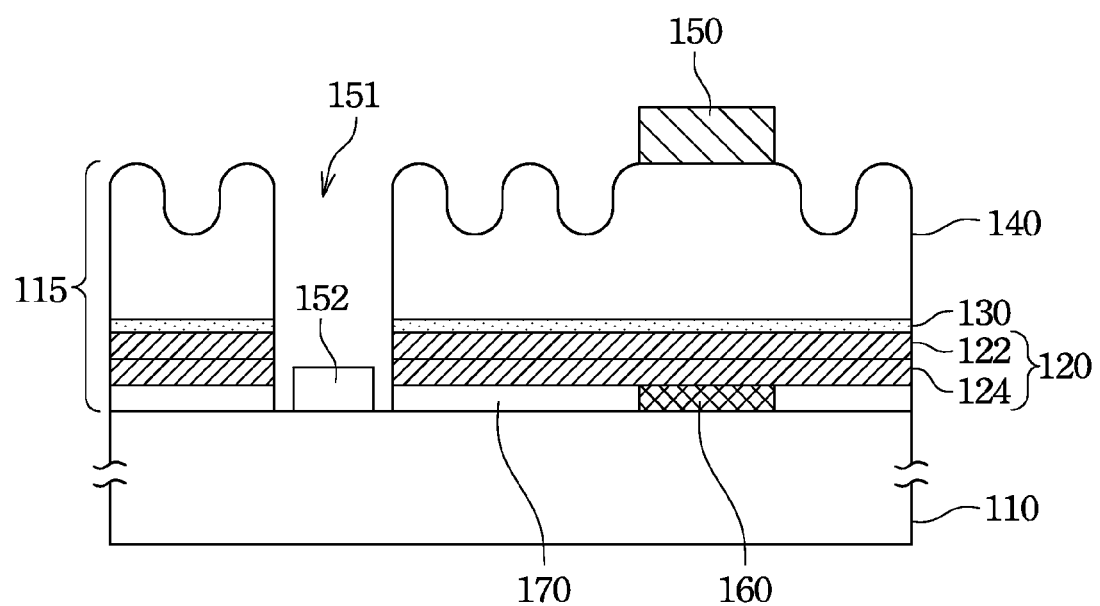
FIG. 8 is a cross-sectional view schematically illustrating a light emitting diode according to still another embodiment of the present invention.

FIG. 8 is a cross-sectional view schematically illustrating a light emitting diode 100 according to still another embodiment of the present invention. The light emitting diode 100 includes a carrying substrate 110, a semiconductor composite layer 115 and electrodes 150, 152.

In this embodiment, the light emitting diode has a structure similar to that shown in FIG. 1, but is different in that the carrying substrate 110 is made of an insulating material. For example, the carrying substrate 110 may be made of a ceramic material such as aluminum oxide, aluminum nitride or beryllium oxide. Since the material of the carrying substrate 110 is different from that described in above embodiments, the electrode 152 is further required. In this embodiment, the light emitting diode has an opening 151 penetrating through the semiconductor composite layer 115, and the carrying substrate 110 is exposed through the opening 151. The opening 151 may be formed by a dry etching process, for example. The electrode 152 is disposed on the carrying substrate 110 within the opening 151. Although a current barrier 160 is shown in this embodiment, person skill in the art may figure out other embodiments that do not include the current barrier 160.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:
1. A light emitting diode, comprising:
   a conductive carrying substrate;
   a semiconductor composite layer disposed on the conductive carrying substrate, wherein an upper surface of the semiconductor composite layer comprises a patterned surface and a flat surface; and
   an electrode disposed on the flat surface;
   wherein the electrode is opposite to the conductive carrying substrate.
2. The light emitting diode according to claim 1, wherein the semiconductor composite layer comprises:
   a current barrier disposed on the conductive carrying substrate;
   a reflecting layer disposed on the conductive carrying substrate and surrounding the current barrier;
   a first semiconductor layer disposed on the current barrier and the reflecting layer;
   an active layer disposed on the first semiconductor layer; and
   a second semiconductor layer disposed on the active layer;
   wherein both the patterned surface and the flat surface are formed on the second semiconductor layer, and a vertical projection of the electrode and a vertical projection of the current barrier on the conductive carrying substrate are totally or partially overlapped.
3. The light emitting diode according to claim 2, wherein an area of the current barrier is greater than or equal to an area of the electrode.
4. The light emitting diode according to claim 2, wherein a conductivity of the current barrier is less than a conductivity of the reflecting layer.
5. The light emitting diode according to claim 2, wherein the first semiconductor layer is a p-type semiconductor layer and the second semiconductor layer is an n-type semiconductor layer.
6. The light emitting diode according to claim 2, wherein the first semiconductor layer is an n-type semiconductor layer and the second semiconductor layer is a p-type semiconductor layer.

7. The light emitting diode according to claim 2, wherein the active layer has a multiple quantum-wells structure.

8. The light emitting diode according to claim 1, wherein the semiconductor composite layer comprises:
- a current barrier disposed on the conductive carrying substrate;
- a reflecting layer disposed on the conductive carrying substrate and surrounding the current barrier;
- a first semiconductor layer disposed on the current barrier and the reflecting layer;
- an active layer disposed on the first semiconductor layer;
- a second semiconductor layer disposed on the active layer, wherein the second semiconductor layer has a buffer layer disposed thereon and the patterned surface is formed on the buffer layer; and
- an opening penetrating through the buffer layer to expose the flat surface of the second semiconductor layer;
- wherein a vertical projection of the electrode and a vertical projection of the current barrier on the conductive carrying substrate are totally or partially overlapped.

9. The light emitting diode according to claim 8, wherein an area of the current barrier is greater than or equal to an area of the electrode.

10. The light emitting diode according to claim 8, wherein the first semiconductor layer is a p-type semiconductor layer and the second semiconductor layer is an n-type semiconductor layer.

11. The light emitting diode according to claim 8, wherein the first semiconductor layer is an n-type semiconductor layer and the second semiconductor layer is a p-type semiconductor layer.

12. The light emitting diode according to claim 8, wherein the active layer has a multiple quantum-wells structure.

13. The light emitting diode according to claim 1, wherein the conductive carrying substrate is made of a conductive material and the conductive carrying substrate serves as a positive electrode of the light emitting diode.

14. The light emitting diode according to claim 1, wherein the patterned surface is a roughness surface.

15. A light emitting diode, comprising:
- a non-conductive carrying substrate;
- a current barrier disposed on a portion of the non-conductive carrying substrate;
- a semiconductor composite layer disposed on the non-conductive carrying substrate and the current barrier, wherein an upper surface of the semiconductor composite layer comprises a patterned surface and a flat surface; and
- an electrode disposed on the flat surface;
- wherein a vertical projection of the electrode and a vertical projection of the current barrier on the non-conductive carrying substrate are at least partially overlapped.

* * * * *